United States Patent [19]

Nuyts et al.

[11] 4,167,790
[45] Sep. 11, 1979

[54] MAGNETIC BUBBLE DOMAIN GATE ARRANGEMENT

[75] Inventors: Walter L. M. C. Nuyts, Mariakerke; Roger A. Vlaeminck, Wondelgem, both of Belgium

[73] Assignee: International Standard Electric Corporation, New York, N.Y.

[21] Appl. No.: 815,639

[22] Filed: Jul. 14, 1977

[30] Foreign Application Priority Data

Jul. 28, 1976 [NL] Netherlands .................. 7608351

[51] Int. Cl.$^2$ .................................. G11C 19/08
[52] U.S. Cl. .................................. 365/15; 365/33; 365/39
[58] Field of Search .................. 365/5, 13, 14, 15, 39

[56] References Cited

U.S. PATENT DOCUMENTS 3,678,287  7/1972  Chow .................................. 365/13
4,011,461  3/1977  Chang et al. .................................. 365/5

Primary Examiner—James W. Moffitt
Attorney, Agent, or Firm—John T. O'Halloran; Jeffrey P. Morris

[57] ABSTRACT

In a gate arrangement, an information input bubble is deflected from an input path into an output path when moving in proximity of a control bubble on a control path in the interaction zone. T- and I-shaped permalloy elements of the control path pattern are so disposed in the interaction zone to create a very stable control bubble position. At the intersection of the output and input paths the latter is situated at most at three times the nominal bubble diameter from the stable control bubble position. Past the intersection, the input path is as close as one bubble diameter to the control bubble so that the information bubble is necessarily deflected. With the gate layout described a bias margin as high as 11,5% is obtained.

12 Claims, 5 Drawing Figures

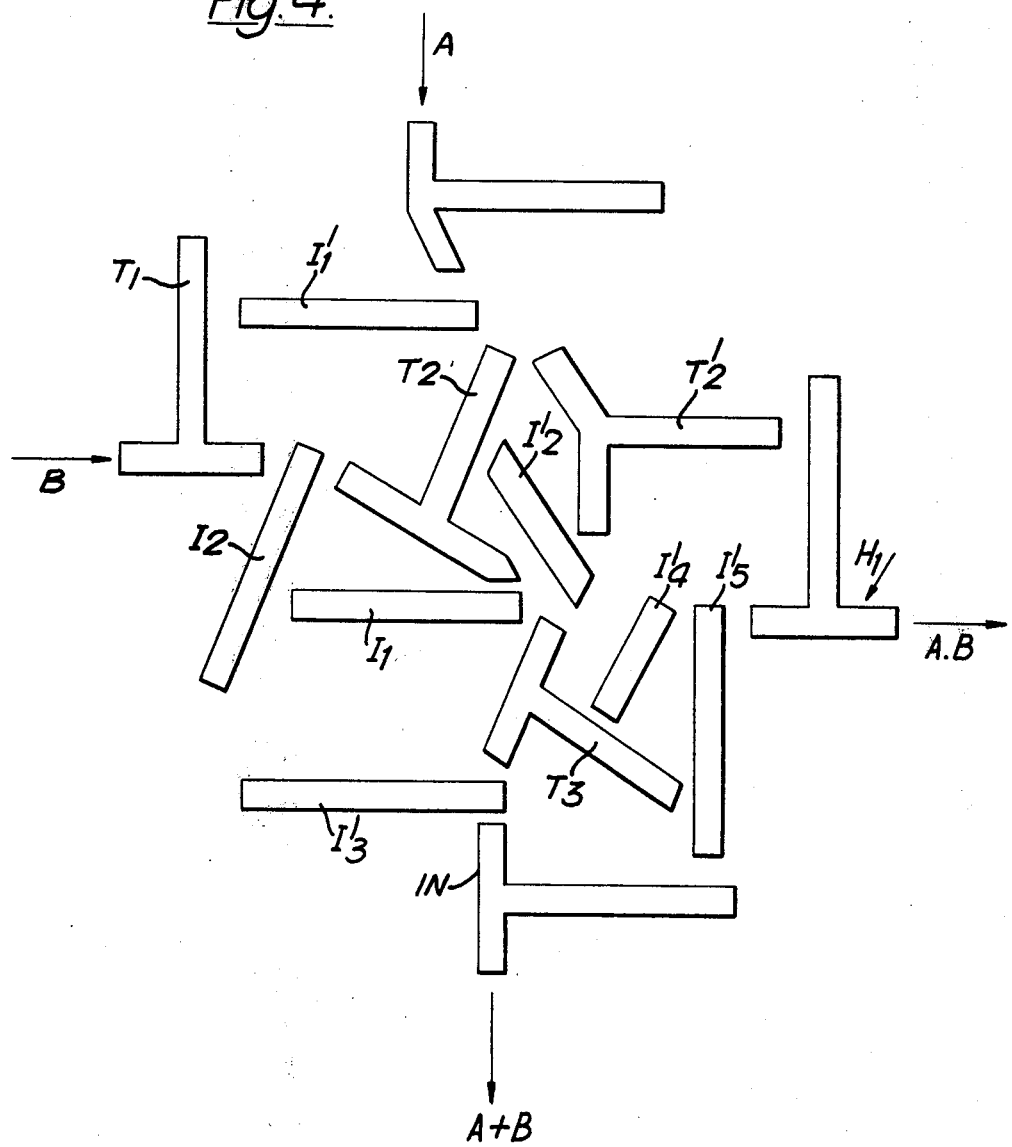

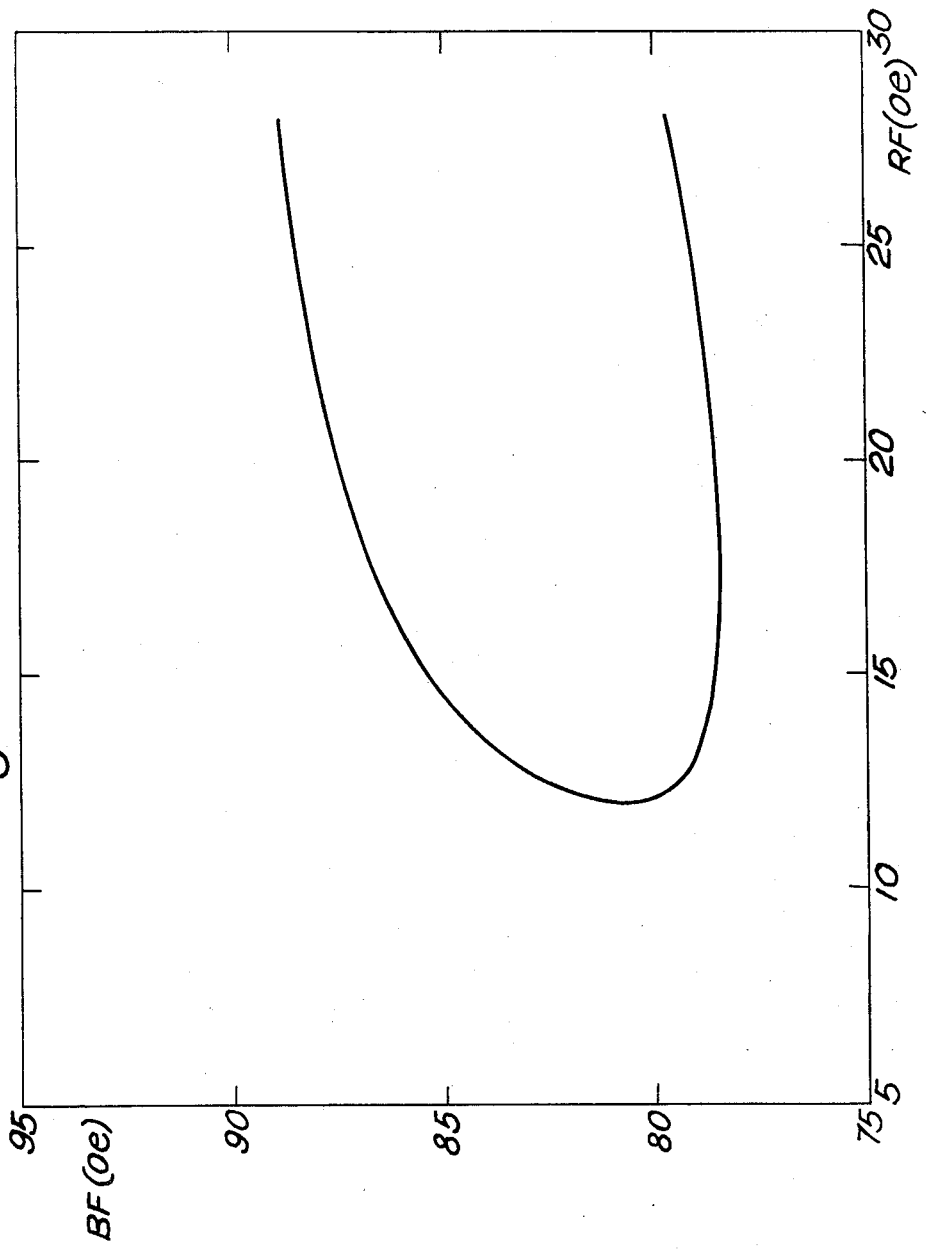

MAGNETIC BUBBLE DOMAIN GATE ARRANGEMENT

BACKGROUND OF THE INVENTION

The invention relates to a magnetic domain arrangement for single wall magnetic domains which are created in said arrangement by means of a magnetic field and which only exist for magnetic field values comprised between two different values thereof, said arrangement including a plurality of co-planar paths and means which are able to propagate said domains along said paths, at least three of which having a path part in proximity of each other whereby a magnetic domain moving on said path part of a first one of said paths may be deviated into a second one of said paths due to the mutual repelling force of said magnetic domain and a second magnetic domain on said third path part.

Such an arrangement is known from the U.S. Pat. No. 3,770,978. In this patent an AND gate is described using the well known magnetic domain technology. A general description concerning the techniques used and the magnetic domains themselves and their propagation is described in the article "Magnetic Bubbles—An Emerging New Memory Technology" by A. H. Bobeck, P. I. Bonyhard and J. E. Geusic published on pages 1176 to 1194 of the Proceedings of the IEEE Vol. 63, No. 8, August 1975. In the method of propagation described therein and which is used in the present invention the magnetic domains or bubbles which can be considered as small magnetic dipoles move in a magnetic layer such as orthoferrite under the influence of the attracting and repulsive forces of successive magnetic poles created into an iterative permalloy pattern deposited on the magnetic layer and follow a path defined by the successive magentic poles. The magnetic poles are induced by an inplane rotating magnetic field parallel to the layer surface and the iterative permalloy pattern may for instance be constituted by a number of T- and bar-shaped elements. A bias field perpendicular to the surface of the layer is used to determine a given bubble diameter. There are two critical bias field values for a given magnetic layer material, i.e., the collapse and the strip-out bias field strength values. For a bias field strength value smaller than the strip-out value, strip domains develop whose magnetization is reversed to that in the remainder of the magnetic layer. When this field strength increases, the bubble diameter decreases until it collapses at the collapse field strength value. In the gate represented in FIG. 7c of the above mentioned U.S. Patent a bubble (21) (called information bubble hereinafter) in an input channel ($x_1$ for instance), is deviated into an output channel ($y_1$) due to the repelling force of a control bubble (44) in a control channel (Z), the control bubble occupying a very stable position in the neighborhood of the output channel to deviate the information bubble from the input channel into the output channel. In this patent no mention is made of the relative distances of the bubble paths in proximity of each other, i.e., the distance between the control bubble and the information bubble (21) prior to its deflection into the output channel and the transmission distance separating the input channel and the output channel to be covered by the information bubble when being deflected from the input path into the output path. These relative distances are however, very important since they influence the bias margin which is the ratio of the difference of the collapse and strip-out bias field strength values and the mean value thereof.

Indeed, the length of this transmission distance influences the collapse field strength in an inversely proportional way. When this length increases or decreases the collapse field strength decreases or increases respectively. This is easily conceivable when it is realized that a bubble has a more stable position when located under a permalloy element of a pattern of a path than when situated in an uncovered area of the magnetic layer. However, the above transmission distance cannot be decreased below predetermined limits, i.e., not much below a nominal bubble diameter. When this would happen a bubble moving in the input channel in the neighborhood of the output channel and without the presence of a control bubble for instance may merge into one large bubble connecting both channels and may further be split, one split half continuing its way on the input channel whilst the other half further propagates on the output channel. This, of course, entails an erroneous operation of the gate. On the other hand, the repelling force of the control and information bubbles decreases with the distance increase between these two bubbles at the deflection point of the gate. When this distance increases beyond a predetermined value the repelling force may be too low to deflect the information bubble into the output channel which again entails an erroneous operation of the gate, whereas when this distance is too small the information bubble may collapse when the control bubble is in a very stable position near the deflection point.

From the above it follows that in order to reach operating bias margins as large as possible and at the same time to assure good operating conditions of the gate certain design rules have to be taken into account.

It is an object of the invention to realize such a magnetic domain gate arrangement.

SUMMARY OF THE INVENTION

The present invention is characterized in that the distance between said path parts of said first and third paths in proximity of said second path is at most equal to three times the mean dimension of said magnetic domain in a direction perpendicular to said plane of movement of said domains and that the distance covered by said first magnetic domain when being deviated from said path part of said first path into said second path is substantially equal to the mean dimension of said magnetic domain seen in a direction perpendicular to said plane of movement of said domains and being defined by a magnetic field value which is the arithmetic mean value of said two different values.

In this way, by combining the above conditions a gate can be realized with large operating margins ensuring an excellent operation under varying conditions of the magnetic fields.

In a preferred embodiment of the invention, the gate arrangement which forms part of a time-slot interchange for a PCM switching system includes a closed control path wherein a control bubble may circulate, an information path along which an information bubble is propagated, and an output path into which the information bubble may be deflected under the repelling forces of the control bubble and information bubble when in proximity of each other. These paths are defined by patterns of a number of permalloy elements deposited on a magnetic material layer wherein the bubbles propagate under the influence of attracting forces of poles which are created at the ends of its elements by means of a rotating magnetic field parallel to the layer surface. The pattern of the control path in proximity of the information path includes two T-shaped and one bar-shaped elements the latter of which forms the bisector of an angle of 60° formed by the transverse legs of the two T-shaped elements thus creating a very stable control bubble position. In proximity of this stable bubble position the information path has a pattern including a bar- and a T-shaped element which define a path part of the information path situated at most at three times the nominal bubble diameter from the stable control bubble position. The first element defining the beginning of the output path is a bar-shaped element which is shorter than the transverse leg of the T-shaped element of the information path and which is also parallel to this transverse leg. The information path is situated at a distance of about one bubble diameter from the beginning of the output path.

The above mentioned and other objects and features of the invention will become more apparent and the invention itself will be best understood by referring to the following description of the preferred embodiments taken in conjunction with the accompanying drawings in which:

BRIEF DESCRIPTION OF THE DRAWINGS

FIG. 4 is another permalloy layout of a magnetic domain gate arrangement according to the invention.

FIG. 5 shows bias margins in function of the rotating magnetic field strength relative to the gate arrangement shown in FIG. 2.

DESCRIPTION OF THE PREFERRED EMBODIMENT

Figure 1:
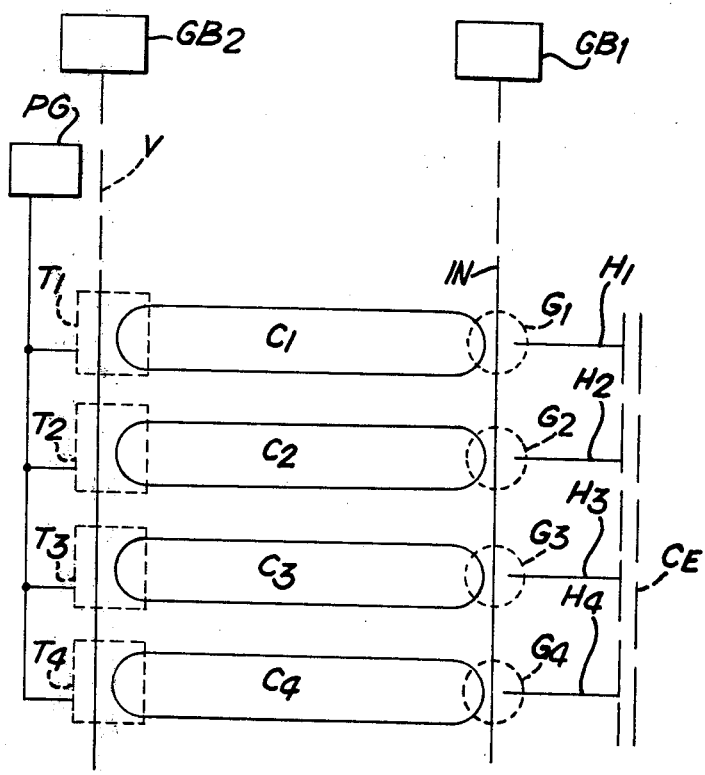
FIG. 1 is a schematic representation of a time-slot interchanger using magnetic domain gate arrangements according to the invention.

Referring to FIG. 1 the time-slot interchanger shown therein is realized according to the magnetic domain technique briefly described in the introductory part. This time-slot interchanger forms part of a time division multiplex switch (not shown) and is able to handle 4 time slots per time frame with two bits per time slot, each bit being represented by the presence or the absence of an information bubble. These information bubbles which are generated by the bubble generator GB1 are fed into the interchanger via the information path IN and can be deflected into one of the four output or horizontal paths H1 to H4 depending on the presence or the absence of control bubbles in the closed control loops C1 to C4 at the gates G1 to G4 respectively. The four horizontal paths lead to a single "chevron" output CE schematically represented by a double dashed line. This chevron output which is able to collect the bubbles from either horizontal path is coupled to a bubble detector (not represented). The above control bubbles merge into the control loops C1 to C4 from the vertical path V via the transfer gates T1 to T4 when these gates are activated by means of a pulse fed to these gates by the pulse generator PG respectively. The bubble generator GB2 feeds control bubbles into the vertical path V.

More details about the above mentioned bubble generators, chevron outputs, transfer gates which are all known in the art can be found in the above mentioned article by A. H. Bobeck, et al and it should be remarked that a similar time-slot interchanger is described in Y. S. Chen's et al paper "An Experimental Magnetic Bubble Time-Slot Interchanger" presented at the 20th annual conference on magnetism and magnetic materials, paper 7D-11, Dec. 3–6, 1974, with the exception of the gates G1 with replicator R shown in FIGS. 1 and 2. A control bubble arriving at R in the control loop is split into two halves. One half continues to circulate in the closed control loop, whilst the other half moves towards the gate G (FIG. 1) where it deflects the information bubble into one of the corresponding horizontal paths. In the time-slot interchanger of the present invention the operation of which is similar to the above mentioned one, gates G1 to G4 (FIG. 1) without replicators are used. One of these gates which are all identical and which will be explained below is shown in FIG. 2.

Figure 2:
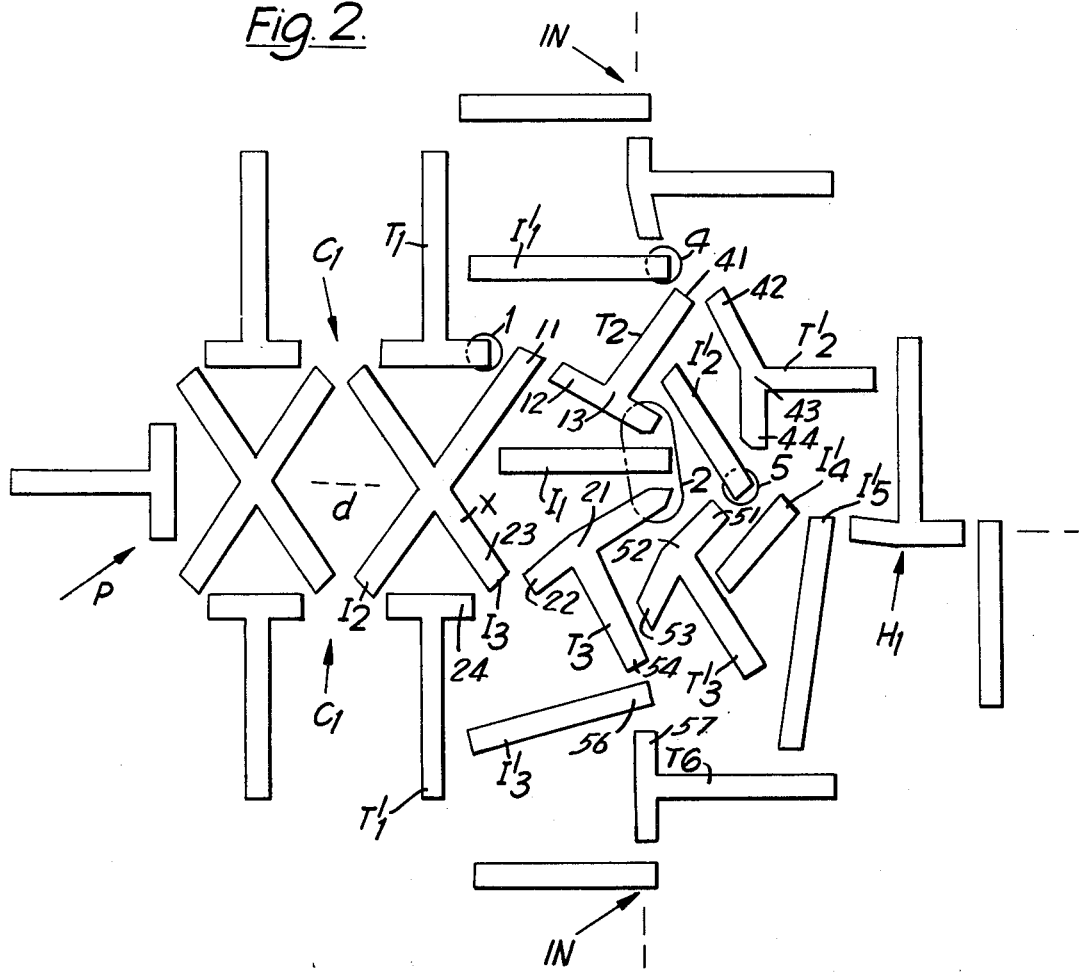
FIG. 2 is a permalloy layout of a magnetic domain gate arrangement of FIG. 1 showing relative magnetic domain positions.

Referring to FIG. 2 the gate arrangement G1 shown therein includes an epitaxial garnet layer covered by an insulating layer (not shown) whereon a structured permalloy pattern is deposited. The garnet layer which has for example a nominal composition of $Sm_{0.5}$ $Y_{2.5}$ $Ga_{1.3}$ $Fe_{3.7}$ $O_{12}$ is grown on a gallium-gadolinium substrate (not shown). The above permalloy pattern defines different bubble paths as mentioned earlier. The bubbles propagate along these paths under the influence of attracting magnetic poles created in these permalloy structures by means of an in-plane rotating magnetic field directed parallelly to the garnet layer surface and which rotates counterclockwise for instance.

A magnetic bias field perpendicular to the garnet layer surface is used to determine the bubble diameter. Above a predetermined maximum bias field strength value the bubble collapses whereas under another predetermined bias field strength value lower than the first value strip domains are formed. For the permalloy gate design shown and the material used these maximum and minimum bias field strength values are shown in function of the rotating field strength in FIG. 5. The means for creating the magnetic fields which are well known in the art are not shown.

Following main paths which are only partly shown may be considered:

1. A closed control path C1 including a closing pattern P and a number of patterns which are all identical to the pattern including T- and X-shaped elements such as T1, T'1 and X respectively (represented by the dashed line d). This X-shaped element has a right (I2) and left (I3) oriented leg. The connection of the closed pattern with the transfer gate T1 has not been shown since this forms no part of the invention. The above control path further includes the path part defined by T-, bar- and X-shaped elements T1, T2, T3, T'1, I1 and X respectively. The bar I1 forms the bisector of an angle of 60° formed by the transverse legs of T-shaped elements T2 and T3.

2. An information path IN including the path parts defined by the transverse legs of T-shaped elements T'2, T'3, longitudinal legs of T-shaped elements T2, T3 and bar-shaped elements I'1, I'2, I'3;

3. A horizontal path H1 including bars I'4, I'5.

The gate in conjunction with the control path C1, the information path IN and the horizontal path H1 operates as follows:

It is supposed that at a given moment a bubble (called control bubble hereinafter) is in position 1 of T1 in the control path C1 and a bubble (called information bubble hereinafter) is in position 4 of bar I'1 in the information path IN, as shown.

Figure 3:
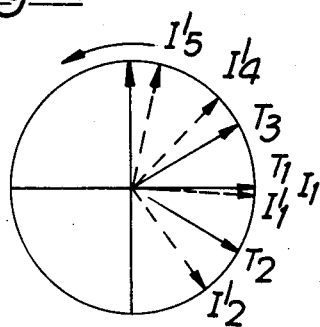
FIG. 3 is a phase diagram of a rotating magnetic field used to propagate the magnetic domains shown in FIG. 2.

The corresponding same direction T1 (solid line), I'1 (dashed line coinciding with T1) of the rotating field is shown in FIG. 3.

When the rotating field rotates from a direction T1 to T3 (solid lines) making hereby more than a complete turn, the control bubble moves from position 1 of transverse leg of T1 to position 2 at the ends of the concurrent bar I1 and transverse legs of T2, T3 while merging into one large bubble at stable position 2 when the driving field rotates from a direction T2 parallel to the transverse leg of T2 to a direction T3 parallel to the transverse leg of T3. To move from position 1 to position 2 the control bubble propagates via end 11 of right oriented leg I2 of X-shaped element X, left end 12 of transverse leg of T2 and position I3 at the junction of transverse and longitudinal legs of T2. For the sake of clearness the intermediate positions of the control bubble are not shown. By further rotation of the field the control bubble further moves on the control path via position 21 at the junction of the longitudinal and transverse legs of T3, position 22 at the left end of transverse leg of T3, position 23 at the lower end of left oriented leg I3 of X, position 24 at the right end of the transverse leg of T1 etc. when the direction of the in-plane magnetic field is successively parallel to the longitudinal and transverse legs of T3, the left oriented leg I3 of X, the transverse leg of T'1 etc. respectively. In the meantime the information bubble, starting from position 4 which corresponds with the rotating field direction I'1, moves to position 5 of bar I'2 via upper end 41 of longitudinal leg of T2, upper end 42, junction 43 of the longitudinal and transverse leg of T'2 and lower end 44 of transverse leg of the same T-shaped element. In position 5 the corresponding rotating field direction is I'2 (FIG. 3). Here also, for the same reasons as above, the intermediate bubble positions are not shown. When the driving field further rotates to become parallel to I'1, the information bubble remains in the same position 5 until the field direction is I'4. Then the information bubble jumps to the upper end of bar I'4 instead of moving to the right end 51 of transverse leg T'3 due to the repelling force of the control bubble which remains in the stable position 2 as explained before. When the in-plane field is parallel to I'5 the information bubble moves to the upper end of I'5. The control bubble remains in place until the in-plane field is parallel to the longitudinal leg of T3. Then it moves to the junction 21 of the transverse and longitudinal legs of T3. By further rotation of the field the control bubble further moves on the closed control path whereas the information bubble propagates on the horizontal path H1.

It should be noted that when the control bubble were not present the information bubble would continue its way on the information path IN via right end 51, junction 52, left end 53 of transverse leg of T'3, lower end 54 of longitudinal leg of T3, right end 56 of bar-shaped element I'3, upper end 57 of transverse leg of T6 etc. The bubble on the information path jumps to position 51 rather than to position I'4 since the length of bar-shaped element I'4 is smaller than the length of the transverse leg of T'3 so that a stronger magnetic pole is created therein. However, with the control bubble in position 2 the information bubble is very near to the large control bubble just before being deflected so that it is subjected to a relatively large repelling force. This repelling force decreases when the distance between the above two bubbles increases and beyond a predetermined value thereof and for a rotating field direction parallel to I'4 the information bubble continues its way on the information path rather than being deviated into the horizontal path since the attracting pole created into the transverse leg of T-shaped element T'3 is stronger than that created into the bar-shaped element I'4. On the other hand the transmission distance to be covered by the information bubble when transmitted from position 5 to bar I'4 just after having been deviated largely influences the collapsing field strength value. Indeed, as explained earlier a bubble situated under a permalloy element is much more stable than when it is situated in the uncovered part of the magnetic layer where it collapses more easily. The above transmission distance cannot be decreased below a predetermined value since then the danger exists that an information bubble arriving at position 5 in the absence of a control bubble extends under bars I'2 and I'4 at position 5 for a low bias field strength comprised between the collapse and strip-out values so that by further movement under the influence of the rotating field the stretched bubble is split, one half being further propagated on the information path whilst the other half is deflected into the horizontal path H1. It has been found that a good combination of the distance of the control and information bubble and the transmission distance is between 2 to 3 nominal bubble diameters and 1 normal bubble diameter respectively, these distances being measured between the bubble centers. The nominal bubble diameter which is 6 micrometers for the garnet material described is defined as a bubble diameter for a bias field strength value equal to the arithmetic mean value of the collapsing and strip-out field strengths. With the above combination and the design shown on FIG. 2 a bias field margin as high as 11.5% at 25 Oersted is obtained, the bias field margin at a given rotating field strength being defined as the ratio of the difference of the collapse and the strip-out bias field strengths and the arithmetic mean value thereof. The bias field margin in function of the rotating field strength is shown in FIG. 5.

It should be noted that the angle formed between the short bar-shaped element I'4 and the long bar-shaped element I'5 is small. In this way the bubble in position 5 is deviated into the horizontal path due to the repulsive action of the controll bubble in position 2 and the attractive force exercised by the magnetic pole created at the upper end of the bar-shaped element I'4 when the in-plane magnetic field is parallel to the bar-shaped element I'4, its magnetic pole being reinforced by that created at the upper end of the bar-shaped element I'5. It has been found that the angle between I'4 and I'5 may not exceed 50°.

The gate arrangement described above is able to perform the logical AND functions A.B and A.$\overline{B}$ on variables A and B wherein A=B=1 means the simultaneous presence of a control bubble and information bubble in proximity of each other in positions 2 and 5 respectively, whereas A or B=0 means the absence of such a bubble. Indeed, in the first case the bubble in position 5 is deflected into the horizontal path H1 which is the output of the AND gate giving the value A.B, whereas the output at the lower part of IN is the output of the AND-gate giving the value A.$\overline{B}$. Indeed, when no control bubble is present ($\overline{B}$=1) a bubble on the information path will continue its way thereon so that A.B̄=1. In all other cases (control bubble present (B̄=0), no information bubble (A=0) A.B̄=0. As for the time-slot interchanger shown on FIG. 1 of the above mentioned article of Y. S. Chen, et al the simultaneous presence of the control bubble and information bubble in the interaction zones of the gates G1 to G4 depends on the moment of generation of the control bubble, the path length situated between the control bubble generator and the gate G1, the path length situated between the information bubble generator and the gate G1, and the path length of the closed control loop. A path length is defined by a number of circuit periods, a circuit period being the distance travelled by a bubble during a complete field rotation.

It should be noted that it is not necessary to have a closed control loop to perform the logical AND function A.B and A.B̄. One could consider an AND-gate with an open control loop wherein for instance the control bubble is anihilated after it has passed the interaction zone.

The gate arrangement shown in FIG. 4 which uses the same design principles as the arrangement of FIG. 2 is similar thereto. Therein the T-shaped elements T3 and T'3 have been replaced by a single T-shaped element T3, so that no closed control loop is provided. The control path includes transverse legs of T-shaped elements T1, T2 and T3 and the ends of bars I2, I1 and I'3. The information path includes transverse legs of T-shaped elements T'2 and T3 and the ends of bars I'2 and I'3. The operation of this gate is similar to that of the gate shown in FIG. 2 except for the control bubble which now follows the lower part of the information path IN. From the above it follows that this gate arrangement is able to perform the logical AND/OR functions A.B and A+B respectively. The outputs of the horizontal path and information path (lower part) are the outputs of the AND and OR gates respectively.

While the principles of the invention have been described above in connection with specific apparatus, it is to be clearly understood that this description is made only by way of an example and not as a limitation on the scope of the invention.

We claim:
1. An arrangement for single wall magnetic domains which are created in said arrangement by means of a magnetic field and which only exist for magnetic field values comprised between two different values thereof, said arrangement including:
   a sheet of magnetic material wherein said domains are generated and are capable of propagation and containing;
   a plurality of co-planar paths;
   means for propagating said domains along said paths, at least three of which having a path part in proximity of each other whereby a magnetic domain moving on said path part of a first one of said paths may be deviated into a second one of said paths due to the mutual repelling force of said magnetic domain and a second magnetic domain on said third path part; wherein the distance between said path parts of said first and third paths in proximity of said second path is at most equal to three times the mean dimension of said magnetic domain and wherein the distance covered by said first magnetic domain when deviated from said path part of said first path into said second path is substantially equal to the mean dimension of said magnetic domain in a direction perpendicular to said plane of movement of said domains and being defined by a magnetic field value which is the arithmetic mean value of said two different values.

2. An arrangement according to claim 1, wherein
   said propagating means includes a rotating magnetic field creating a succession of magnetic attracting poles in a structured pattern, said pattern being comprised of soft magentic overlay element means deposited on said sheet material to define said paths; and
   wherein a pattern defining said path part of said third path is comprised of:
   two T-shaped elements; and
   one bar-shaped element, said elements being so disposed that said bar-shaped element and the transverse legs of said two T-shaped elements point to a common point, thereby creating a very stable second domain position to deviate said first domain into said second path and that proximate to the intersection point of said first and second paths a second pattern defining said path part of said first path includes a bar-shaped element and a T-shaped element the transverse leg of said T-shaped element forming a substantially sharp angle with the transverse leg of one of said two T-shaped elements, and wherein said bar-shaped element forms a substantially sharp angle with the transverse leg of the other of said two T-shaped elements of said third path.

3. An arrangement according to claim 2, wherein the element of the pattern of said second path situated nearest to said intersection point of said first and second paths is a bar-shaped element arranged substantially parallelly to the transverse leg of said T-shaped element of said first path, said transverse leg being longer than said bar-shaped element which is followed by another bar-shaped element, which is also longer than said preceding bar-shaped element and forms therewith an angle less than or equal to 50°.

4. An arrangement according to claim 3, wherein said second magnetic domain is maintained in said stable position during a first predetermined time interval and that a second time interval required by said first magnetic domain to transverse the distance between said first and second path is less than or equal to said first time interval.

5. An arrangement according to claim 2, wherein said bar-shaped element forms the bisector of an angle substantially equal to 60° which is formed by said transverse legs of said two T-shaped elements of said first pattern, the ends of the longitudinal legs of said T-shaped elements forming part of said first path.

6. An arrangement according to claim 5, wherein said third path forms a closed loop.

7. An arrangement according to claim 5, further comprising:
   means for coupling variables A and B to said arrangement; and
   means for deriving an output from said arrangement, said output corresponding to the logic operations A.B and A.B̄ on said variables, such that said arrangement comprises a logic AND gate.

8. An arrangement according to claim 6, further comprising:
   means for coupling variables A and B to said arrangement; and means for deriving an output from said arrangement, said output corresponding to the logic operations A.B. and A.B̄ on said variables, such that said arrangement comprises a logic AND gate.

9. An arrangement according to claim 2, wherein said T-shaped element of said first path and said one T-shaped element of said third path substantially coincide to a single T-shaped element whereby said third path conjugates said first path at said one T-shaped element, the transverse leg of which forming the common element of said first and third paths at the junction of both said paths.

10. An arrangement according to claim 8 further including:
   means for coupling input data to said arrangement; and
   means for deriving output data from said arrangement, such that said input data is operated upon by said arrangement in the manner of a logic AND-/OR gate.

11. An arrangement according to claim 1, wherein said distance between said path parts of said first and third paths in proximity of said second path is at least equal to twice said mean dimension of said magnetic domain.

12. In a time division multiplex switch for binary signals, a gate structure for single wall magnetic domains which are created in said gate structure by means of a magnetic field and which exist for magnetic field values comprised between two different values thereof, said gate structure including:
   a sheet of magnetic material wherein said domains are capable of propagation and containing a plurality of co-planar paths;
   means for propagating said domains along said paths, at least three of which having a path part in proximity of each other whereby a magnetic domain moving on said path part of a first one of said paths may be deviated into a second one of said paths due to the mutual repelling force of said magnetic domain and a second magnetic domain on said third path part;
   wherein the distance between said path parts of said first and third paths in proximity of said second path is at most equal to three times the mean dimension of said magnetic domain and wherein the distance covered by said first magnetic domain when deviated from said path part of said first path into said second path is substantially equal to the mean dimension of said magnetic domain in a direction perpendicular to said plane of movement of said domains and being defined by a magnetic field value which is the arithmetic mean value of said two different values.

* * * * *